(12) United States Patent
Han

(10) Patent No.: US 8,278,856 B2
(45) Date of Patent: Oct. 2, 2012

(54) LOW LOSS LOW NOISE MOTOR CONTROL SYSTEM

(75) Inventor: Hyeong Han, Markham (CA)

(73) Assignee: Flextronics Automotive Inc., Newmarket, Ontario (CA)

( * ) Notice: Subject to any disclaimer, the term of this patent is extended or adjusted under 35 U.S.C. 154(b) by 92 days.

(21) Appl. No.: 12/963,112

(22) Filed: Dec. 8, 2010

(65) Prior Publication Data

US 2012/0146564 A1   Jun. 14, 2012

(51) Int. Cl.
*H02P 6/14* (2006.01)
(52) U.S. Cl. ......... 318/400.27; 318/400.26; 318/400.01; 318/700
(58) Field of Classification Search ............. 318/400.27, 318/400.26, 400.01, 700
See application file for complete search history.

(56) References Cited

U.S. PATENT DOCUMENTS 6,650,072 B2 * 11/2003 Harlan ................... 318/400.2
6,897,707 B2 *  5/2005 Beck ........................ 327/427

* cited by examiner

*Primary Examiner* — Walter Benson
*Assistant Examiner* — David Luo
(74) *Attorney, Agent, or Firm* — Volpe and Koenig, P.C.

(57) ABSTRACT

In one embodiment, a system for reducing component noise in a motor in a automobile includes a first gate driver and a second gate driver, a high side FET; a low side FET; a charge pump circuit; a high frequency reduction component; and a timing signal source. The timing source signal interconnected to the charge pump, the first gate driver, and the second gate driver, the first gate driver interconnected with the charge pump, the first gate driver interconnected with the high side FET, the high side FET and the low side FET interconnected with the high frequency reduction component, the timing signal source providing timing signals to the signals to the first gate driver, the second gate driver, and the charge pump circuit such that the PWM slope is dull enough to prevent RE EMC, wherein the timing signal source provides three timing signals.

5 Claims, 7 Drawing Sheets

LOW LOSS LOW NOISE MOTOR CONTROL SYSTEM

BACKGROUND

The automation of automotive systems has become popular in many types of automobiles and other vehicles. Automotive moving systems such as Power Lift-gate, Power Window and Power Sliding Door include one or more brush type DC motors that require a motor speed control. The target of a motor speed control for the automation of automotive systems is not for achieving a constant motor speed, but for achieving motor speed profile in which the target speed is varied depending on the mechanical system's lateral or angular position.

In order to achieve a speed control, power applied to the motor needs to be controlled. The most commonly utilized is Pulse Width Modulation (PWM) control in which the applied motor voltage is switched at a fixed frequency while the duty cycle is varied by a microprocessor unit programmed to achieve the target speed control. A control module performs PWM control and supplies PWM power to the motor.

One of the side effects of PWM control is that it produces noise coming from mechanical system that becomes nuisance depending on its frequency. To eliminate audible noise, 20 KHz or a higher frequency is commonly used for PWM frequency. In conventional PWM control, PWM pulse train signal is transmitted to the motor though the wires. High frequency harmonic components of PWM pulse train signal in the motor interface wires cause AM band (500 KHz to 1.6 MHz) radiated emission (RE) problems in the case, PWM waveform has a such sharp edge to have shorter rise and fall time than 10 usec.

One method of preventing resonance or other vibration issues is to provide a PWM waveform slope dull enough to prevent RE EMC problems from occurring. In most of automotive moving system applications, in which max operating current is 10 A or greater, setting PWM slope dull enough to prevent RE EMC issue is not achievable without using a good thermal characteristic heat sink and a metal housing. Making a longer rise or fall time increases power dissipation of the FET and maximum applicable rise or fall time to set is limited by FET's thermal capability and the control's operating ambient temperature requirements.

SUMMARY

In one embodiment a Low Loss Low Noise Motor Control System addresses power efficiently and cost effectively limiting the noise components generated by PWM in automotive moving control design. In another embodiment a Low Loss Low Noise Motor Control System reduces noise in electric motor components.

In one embodiment, the Low Loss Noise Motor Control System provides 50 KHz or higher for PWM frequency to prevent audible noise and to reduce filter component sizes to accommodate them and all of the other module components in a module size constraint; reduces high frequency components from PWM power supplied to the motor enough to prevent RE emission problems from occurring; reduces switching loss to prevent power dissipation of the FET from exceeding the thermal capability of the FET without having a heat sink without requiring thermal management control; and the PWM control circuit needs to be compatible with automotive transients including automotive Load Dump.

In one embodiment, a system for reducing component noise in a motor in an automobile includes a first gate driver and a second gate driver, a high side FET; a low side FET; a charge pump circuit; a high frequency reduction component; and a timing signal source. The timing source signal interconnected to the charge pump, the first gate driver, and the second gate driver, the first gate driver interconnected with the charge pump, the first gate driver interconnected with the high side FET, the high side FET and the low side FET interconnected with the high frequency reduction component, the timing signal source providing timing signals to the signals to the first gate driver, the second gate driver, and the charge pump circuit, wherein the timing signal source provides three timing signals, the three timing signals including a first timing signal provided to the first gate driver, the first signal being a HSD PWM signal for the high side FET, a second timing signal provided to the second gate driver, the second signal being a LSD PWM signal for the high side FET, and a third timing signal provided to the charge pump. In one alternative, the system further includes a sense resistor; and a first and second operational amplifier, for MCUs monitoring forward and reverse current and protecting the high and low side FET.

In one embodiment an improvement to a noise reduction component for a motor, includes a first FET and a power rectifier, used for freewheeling while first FET is off, with the improvement including replacing the power rectifier with a second FET, the second FET configured to switch off while the first FET is on and to switch on with the first FET is off. In one alternative, the improvement further includes providing a microprocessor, the microprocessor issuing three timing signals, the three timing signals including a first timing signal provided to a first gate driver, the first signal being a HSD PWM signal for the second FET, a second timing signal provided to a second gate driver, the second signal being a LSD PWM signal for the second FET, and a third timing signal provided to a charge pump.

In one embodiment a noise reduction component for a motor includes a first and second FET, characterized by a less than 10% loss rate for the circuit power. Optionally the noise reduction component is characterized by a less than 5% loss rate for the circuit power. Optionally, the second FET is configured to switch off while the first FET is on and to switch on with the first FET is off. Optionally the noise reduction component further includes a first gate driver and a second gate driver; a charge pump circuit; a high frequency reduction component; and a timing signal source; the timing source signal interconnected to the charge pump, the first gate driver, and the second gate driver, the first gate driver interconnected with the charge pump, the first gate driver interconnected with the first FET, the first FET and the second FET interconnected with the high frequency reduction component, the timing signal source providing timing signals to the signals to the first gate driver, the second gate driver, and the charge pump circuit.

In another embodiment a system for reducing component noise in a motor includes a first gate driver and a second gate driver; a high side FET; a low side FET; a charge pump circuit; a high frequency reduction component; and a timing signal source; the timing source signal interconnected to the charge pump, the first gate driver, and the second gate driver, the first gate driver interconnected with the charge pump, the first gate driver interconnected with the high side FET, the high side FET and the low side FET interconnected with the high frequency reduction component, the timing signal source providing timing signals to the signals to the first gate driver, the second gate driver, and the charge pump circuit. In one alternative the system further includes a sense resistor; and a first and second operational amplifier, for MCU's monitoring forward and reverse current and protecting the high and low side FET. Optionally, the timing signal source provides three timing signals. Alternatively, the three timing signals includes a first timing signal provided to the first gate driver, the first signal being a HSD PWM signal for the high side FET. In another alternative, the three timing signals includes a second timing signal provided to the second gate driver, the second signal being a LSD PWM signal for the high side FET. Alternatively, the three timing signals include a third timing signal provided to the charge pump. In another alternative, the high frequency reduction component is an inductor and a capacitor. Optionally, the timing signal source is a microprocessor. In one alternative the system includes a relay, enabling bi-directional motor operations.

BRIEF DESCRIPTION OF THE DRAWINGS

For a more complete understanding of the features and advantages of the Low Loss Low Noise Motor Control System, reference is now made to the detailed description along with the accompanying figures in which corresponding numerals in the different figures refer to corresponding parts and in which.

DETAILED DESCRIPTION

Figure 1:
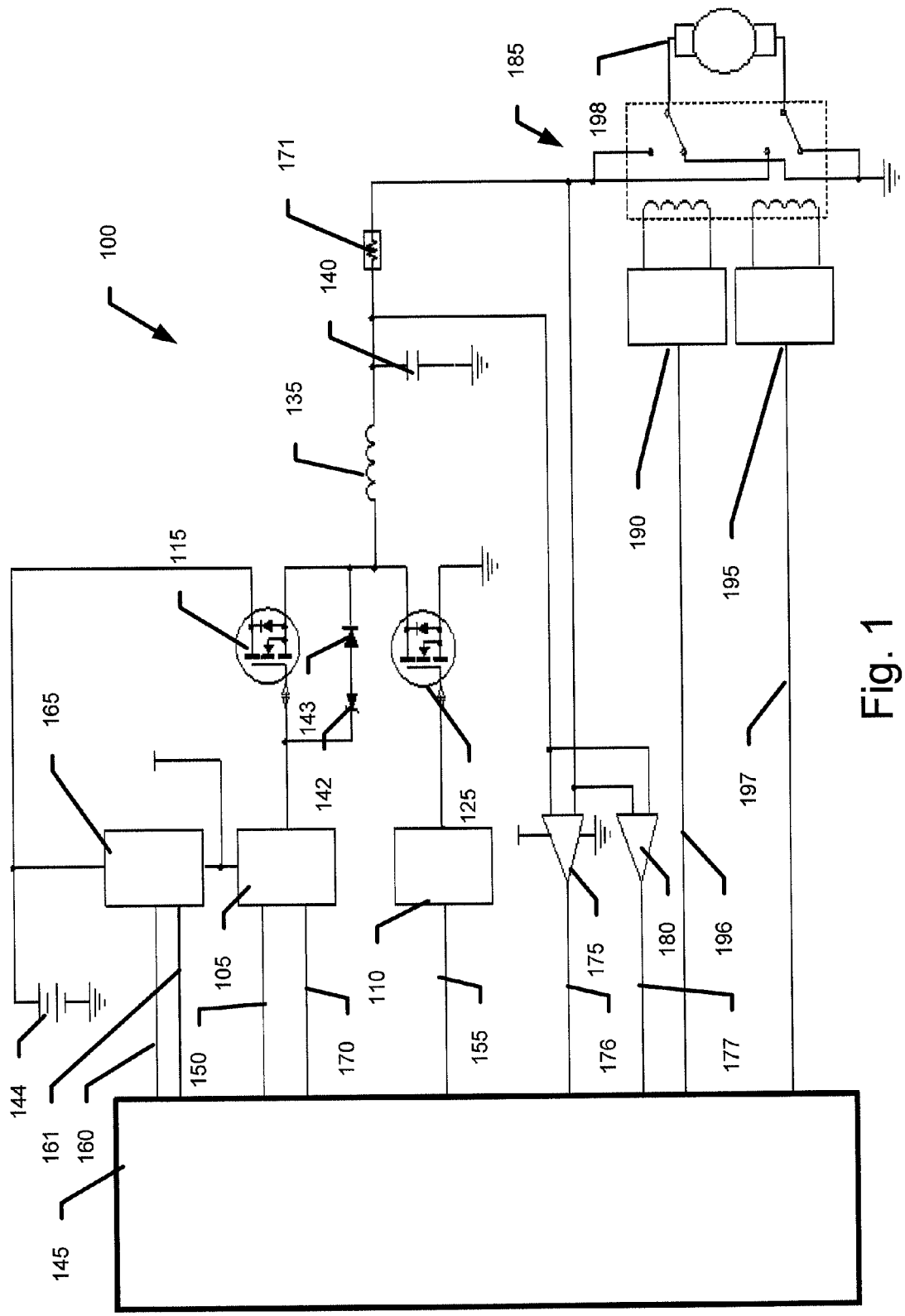
FIG. 1 shows one embodiment of a Low Loss Low Noise Motor Control System.

In the following detailed description of the illustrative embodiments, reference is made to the accompanying drawings that form a part hereof. These embodiments are described in sufficient detail to enable those skilled in the art to practice a Low Loss Low Noise Motor Control System and related systems and methods, and it is understood that other embodiments may be utilized and that logical structural, mechanical, electrical, and chemical changes may be made without departing from the spirit or scope of this disclosure. To avoid detail not necessary to enable those skilled in the art to practice the embodiments described herein, the description may omit certain information known to those skilled in the art. The following detailed description is, therefore, not to be taken in a limiting sense.

As will be appreciated by one of skill in the art, aspects of a Low Loss Low Noise Motor Control System and related systems and methods may be embodied in an integrated circuit, an FPGA, or other hard or soft programmable processor. Accordingly, aspects of a Low Loss Low Noise Motor Control System and related systems and methods may take the form of an entirely hardware embodiment or an embodiment combining software and hardware aspects.

As described above in the background, in many automotive applications, as well as other systems utilizing electric motors, speed control for the electric motor is needed for the proper function of the system. A commonly used technique for control is Pulse Width Modulation (PWM) in which the applied motor voltage is switched at a fixed frequency while the duty cycle is varied by a microprocessor unit performing the control as per the strategy implemented in software.

A side effect of PWM is that operations at certain frequencies of modulation are audible or interfere with other commonly used frequencies, such the AM band (500 KHz to 1.6 MHz). This is in part due to the sharp rise and fall of the waveform.

Therefore, one method that eliminates the interference is to dull the wave form, such that the slope is gradual enough not to create RE EMC interference. One method of preventing resonance or other vibration issues is to provide a PWM waveform slope dull enough to prevent RE EMC problems from occurring. One method of doing this in automotive moving system applications, in which max operating current is 10 A or greater, is to set the PWM slope dull enough to prevent RE EMC issues by using a good thermal characteristic heat sink and a metal housing. Making a longer rise or fall time increases power dissipation of the FET and maximum applicable rise or fall time to set is limited by FET's thermal capability and the control's operating ambient temperature requirements.

A negative of this methodology is that a significant amount of energy is lost in the form of heat. In order to prevent this loss, an embodiment of a Low Loss Low Noise Motor Control System may be used. Therefore in one embodiment, a Low Loss Low Noise Motor Control System provides a control module circuit that can provide motor control by supplying a higher frequency PWM power to brush-type DC motors for a vehicle moving system, while meeting the requirements and constraints described below:

Provide 50 KHz or higher for PWM frequency to prevent audible noise and to reduce filter component sizes to accommodate them and all the other module components in a module size constraint.

Reduce high frequency components from PWM power supplied to the motor enough to prevent RE emission problems from occurring.

Reduce switching loss to prevent power dissipation of the FET from exceeding the thermal capability of the FET without having a heat sink without requiring thermal management control.

PWM control circuit needs to be compatible with automotive transients including automotive Load Dump.

To reduce high frequency components from PWM power supplied to the motor, an inductor capacitor filter is used at the output of PWM power generator. A design of a gate driver and a charge pump that can provide enough charge to the FETs and is compatible with Load Dump transient is disclosed.

To effectively utilize the thermal capability of the PWM FETs, the two N-channel FETs, HSD FET and LSD FET, are configured to work as a push-pull power switch, having HSD FET source connected to LSD FET drain. The LSD FET replaces a diode used for freewheeling in the conventional PWM power generator. The LSD FET dissipates only 10% or 20% of the power of the freewheeling diode dissipates. The HSD FET and LSD FET pair dissipates much less power than a FET and a diode pair, which will reduce air temperature inside the module and increase power dissipation budget.

Power dissipation of the switching device, Field Effect Transistor (FET), is proportional to the frequency and rise/fall time of the applied PWM waveform. Applying both, 20 KHz for PWM frequency and 10 usec for rise/fall time for a system that requires 10 A or greater operating current makes power dissipation for the FET beyond the device spec limit, thus in most of cases it is not applicable unless the FET is mounted on a good thermal characteristic heat-sink inside a metal housing.

An Inductor-Capacitor filter (LC filter) can be put in the output of PWM generator, which will reduce high frequency components from motor wire enough to prevent RE problems even for the systems that have a shorter rise/fall time of PWM waveform than the guide line. However, the challenges described below prevent or limit applicability of the technology.

The component sizes of the inductor and the capacitor are too big to accommodate within the commonly applied control module size, 5.5"×3.5"×1" for modules' W×H×D constraint, applied to meet vehicle OEM requirement or make module competitive.

Thus required rise time/fall time duty cycle to limit power dissipation of the FET and prevent requiring a heat sink for 10 A operating current system, is less than 2.5% of the period: 0.5 usec for 50 KHz PWM or 0.25 usec for 100 KHz PWM.

In one embodiment, a gate driver IC meeting the rise time/fall time requirement for the high voltage (50V or higher) FET's suitable for automotive application. Designing a customized IC, compatible with automotive transient power is a huge challenge as IC's generally do not have enough transient power dissipation capability required to endure the vehicle Load Dump transient having 50V peak voltage and 200 msec duration.

Referring to FIG. 1, one embodiment of Low Loss Low Noise Motor Control System 100 includes Microprocessor unit 145, Charge pump 165, First gate driver 105, Second gate driver 110, High side FET 115, Low side FET 125, zener diode 142, diode 143 (zener diode 142, diode 143 function as a gate-source voltage suppresser and alternatives will be apparent to those skilled in the art in light of this disclosure), Inductor 135, Capacitor 140, Current sensing resistor 171, Operational amplifier IC's 175, 180, H-bridge relay 185 and Relay coil drivers 190,195, Motor 198, and power supply Vbatt 144.

In some cases there are side effects to PWM control, including:

1. Providing a PWM power to the motor may cause the mechanical system produce audible noise, which becomes nuisance depending on its frequency. To eliminate the audible noise, 20 KHz or a higher frequency is used for PWM control.
2. Providing a PWM power to the motor makes radiated electromagnetic emissions (RE), which become potential interference noise sources for AM band (500 KHz to 1.6 MHz) receiver units.

Functions of the components for Low Loss Low Noise Motor Control System are described as follows. Charge pump 165, First gate driver 105, Second gate driver 110, High side FET 115, Low side FET 125, zener diode 142, diode 143 (zener diode 142, diode 143 function as a Gate-source voltage suppresser and alternatives exist), Inductor 135, Capacitor 140, Current sensing resistor 171, Operational amplifier IC's 175, 180, H-bridge relay 185 and Relay coil drivers 190,195, Motor 198, and power supply Vbatt 144.

Microprocessor unit 145:
Provides timing signals for Charge pump 165, First gate driver 105 and Second gate driver 110.
Monitors motor currents for the dual modes, active current during which the motor is being driven, and passive current during which motor is in braking mode.
Provides ON or OFF signal for Relay coil drivers 190, 195.

Charge Pump 165: Produces as output VCP with a voltage of 7V nominal plus Vbatt voltage level, which is used for power source for first gate driver 105.

First gate driver 105: Produces a gate signal for High side FET 115.

Second gate driver 110: Produces a gate signal for Low side FET 125.

High Side FET 115: Provides a high voltage and active current to the motor power while its gate signal is high.

Low Side FET 125: Provides a low voltage and passive current to the motor while its gate signal is high.

Zener diode 142, diode 143, which may be replaced by alternative suppression circuits:
Suppresses gate to source voltage and protects of High side FET 115 from a high voltage.

Resistor 135 and capacitor 140: Reduces high frequency components from PWM power supplied to the motor.

Resistor 171: Provides a motor current feedback signal which is proportional to motor current.

Operational amplifier IC 175: Amplifies and converts a motor current feedback signal to an active current monitoring input, Active_C_MON 176.

Operational amplifier IC 180: Amplifies and converts a motor current feedback signal to a passive current monitoring input, Passive_C_MON 177.

Relay 185: Provides switches for on-off and direction controls for the motor.

Relay Coil Driver 190: Provides a power to the relay coil to turn on the relay switch for providing a high voltage to CW High 196.

Relay Coil Driver 195: Provides a power to the relay coil to turn on the relay switch for providing a high voltage to CCW High 197.

As will be appreciated by one of skill in the art, aspects of a Low Loss Low Noise Motor Control System and related systems and methods may be embodied in an integrated circuit, an FPGA, or other hard or soft programmable processor. Accordingly, aspects of a Low Loss Low Noise Automotive Motor Control System and related systems and methods may take the form of an entirely hardware embodiment or an embodiment combining software and hardware aspects.

One embodiment of a method of designing gate drivers with discrete components, includes the following steps:
Confirm gate charge spec of the FET.
Confirm required charge transfer for the gate driver.
Implement a Charge pump 165 as per the disclosed in the detail below.
Implement a First gate driver 105 as per the disclosed in the design detail below.
Implement a Second gate driver 110 as per the disclosed in the design detail below.
Implement a Gate-source voltage suppresser (for example, zener diode 142, diode 143) as per the disclosed in the design detail below.

In one alternative, current sense resistor 171 and Operational amplifiers 175 and 180 are used optionally for MCU's monitoring forward or reverse current (using signals F MC MOM 196 and F MC MOM 197 respectively) and protecting FET 115 and FET 125. In another alternative, relay coil driver 185 includes a BJT with a diode or a stand-alone device, a small signal FET integrated relay coil driver for Driver 190 and Driver 195. Relay 185 is an H bridge relay, used in case of bi-directional motor operation.

Design Detail of Charge Pump 165

Figure 2:
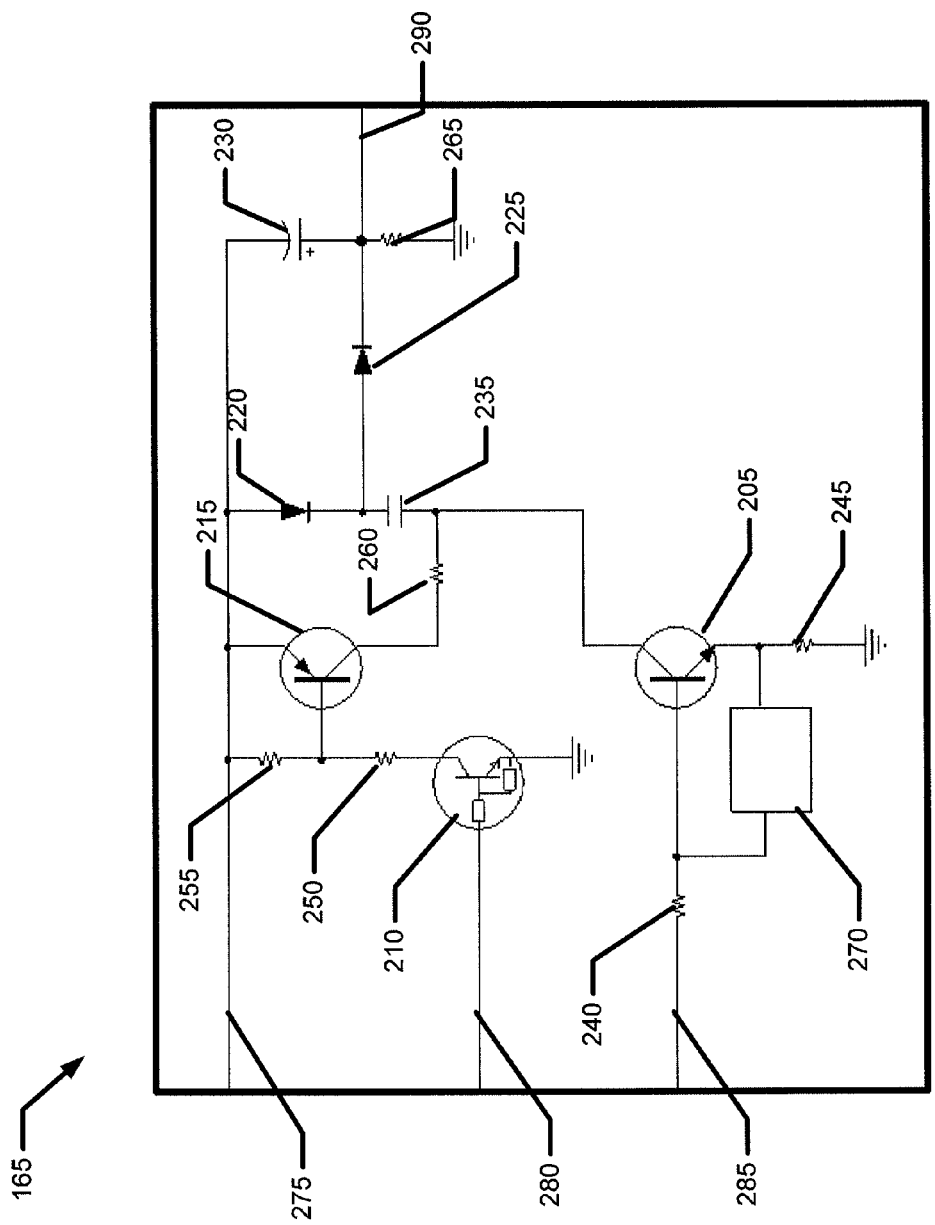
FIG. 2 shows one embodiment of charge pump used in a Low Loss Low Noise Motor Control System.

Referring to FIG. 2, the charge pump circuit consists of BJTs 205, 210, 215, diodes 220, 225, Capacitors 230, 235, Resistors, 240, 245, 250, 255, 260, 265, and Current Feedback generator 270.

Functions of the components are described as follows:

Resistor 240: Limits BJT 205 base current.

Resistor 245: Provides feedback signal the voltage of which is proportional to BJT 205 emitter current.

Current Feedback generator 270: Converts the feedback signal to a control signal suitable for Base of BJT 205, which adjust BJT 205 base voltage and makes BJT 205 supply a constant current while CP_PWM2 285 signal is high.

BJT 205: Provides a current provided from Vbatt 275 to the path diode 220, capacitor 230, collector of BJT 205, emitter of BJT 205, resistor 245 and GND, which charges capacitor 230, when CP_PWM2 285 is high.

BJT 210: Provides a current provided to base of BJT 215 when CP_PWM1 280 is high, which turns ON BJT 215.

Resistor 250: Limits BJT 215 base current and BJT 210 collector current.

Resistor 255: Prevents unintended turning-on of BJT 215 by a leakage current through BJT 210.

BJT 215: Provides a high voltage charging current to VCP node 290 through resistor 260, capacitor 230 and diode 225 when it is ON.

Resistor 260: Limits Vbatt 275 source current supplied to VCP node 290 through resistor 260, capacitor 230 and diode 225 when BJT 215 is ON.

Capacitor 230: Charge is increased while BJT 205 is ON and the increased charge is transferred to VCP node 290 while BJT 215 is ON.

Capacitor 235: Charge is increased while BJT 215 is ON and provides increased charge to VCP node 290 load when BJT 215 is OFF.

Diode 220: Prevents a current flowing into Vbatt 275 while BJT 215 is ON.

Diode 225: Prevents current flowing into capacitor 230 from capacitor 235 while BJT 205 is ON.

Resistor 265: Provides a current to discharge capacitor 235 when VCP node 290 is OFF.

The function of Charge pump 165 is to produce charge pump output VCP 290, 7V nominal plus Vbatt 275, which is power source for first gate driver 105.

To get VCP 290 regulated over the operating voltage range of Vbatt, 9.5V to 16V, charge transferred needs to be controlled.

Charge transfer is controlled by varying PWM duty of CP_PWM signals.

To make charge transferred linearly dependent on duty of PWM signals, charging current needs to be regulated to be constant.

For this purpose, Current Feedback generator 270 is utilized.

MCU 145 monitors Vbatt periodically and detects over voltage transients and turns off the signals within a duration which is short enough to protect BJT 205 from the transient energy.

MCU 145 monitors VCP voltage and dynamically adjusts duty of CP_PWM1 160 and CP_PWM2 161 to get VCP regulated within the target, 7V+/−0.5V.

Design Detail of Current Feedback Generator 270 Option 1 of Charge Pump 305

Figure 3B:
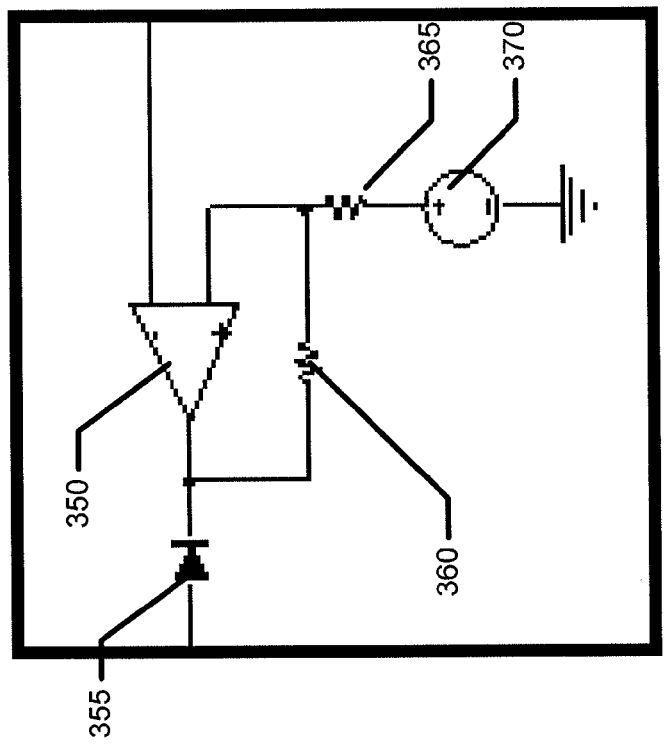
FIG. 3b shows another embodiment of current feedback generator.
Figure 3A:
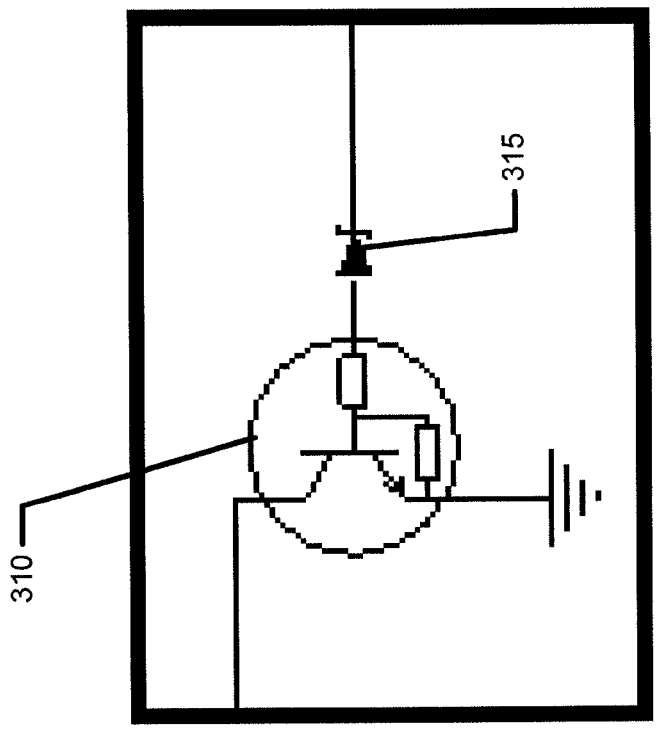
FIG. 3a shows one embodiment of current feedback generator used in a Low Loss Low Noise Motor Control System.
Figure 4:
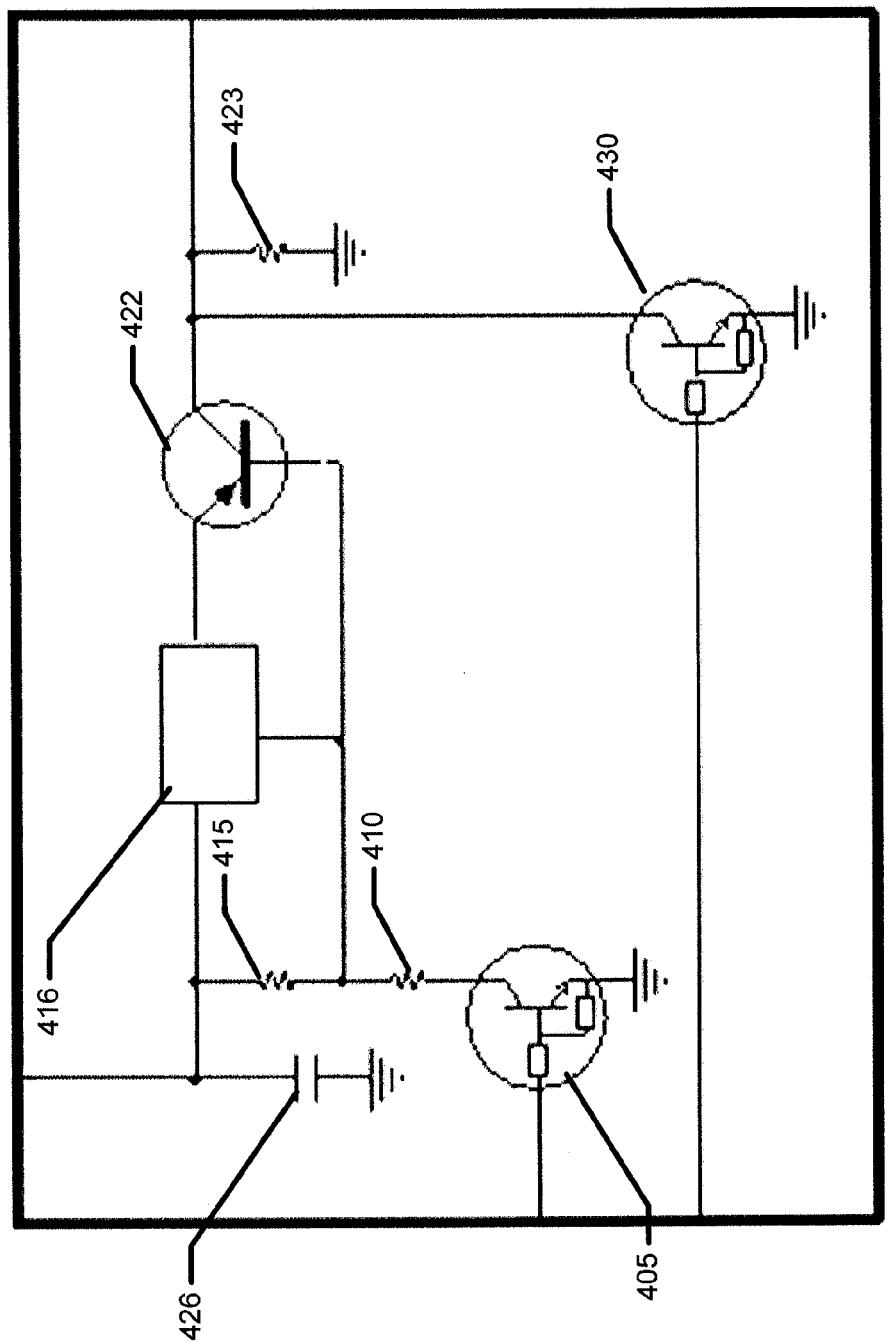
FIG. 4 shows one embodiment of first gate driver.

Referring to FIG. 3a, the current feedback generator 270 consists of BJT 310 and zener diode 315.

A 2V zener diode 315 is used to compare the feedback signal with the zener voltage and provides a current to BJT 310 base, which drives BJT 310 to produce a feedback current provided to BJT 310 base of Charge pump.

Design Detail of Current Feedback Generator 270, Option 2

Referring to FIG. 3b, the current feedback generator 270 consists of comparator 350, diode 355, resistors 360, 365, and voltage source of Vref 370, which is configured with 5V regulator and a voltage divider comprised with a pair of resistors.

The comparator 350 compares the feedback signal with the reference voltage Vref 370 and provides a current to the diode 355 to produce a feedback current provided to BJT 205 base of Charge pump.

Design Detail of the First Gate Driver 105

It consists of Capacitor 426, Resistor 415, Resistor 410, Current feedback generator 416, BJT 422, BJT 405, BJT 430 and Resistor 423.

Functions of the components are described as follows:

Capacitor 426: Decouples ripple current from VCP, charge pump output voltage.

Resistor 415: Prevents unintended turning-on of BJT 422 by a leakage current passing through digital BJT 405.

Resistor 410: Limits base current of BJT 422 and collector current of Digital BJT 405.

Current feedback generator 416: Provides a constant current for HSD_Gate signal, during transition of FET.

BJT 422: Provides a high level to HSD_Gate signal.

BJT 430: Provides a low level to HSD_Gate signal.

Resistor 423: Provides a low impedance to prevent unintended turn-on of the FET from by noises.

The function of the first gate driver 105 is to produce a Gate signal for High side FET 115, which is required to have less than 2.5% of the period for rise time/fall time of switching: 0.5 usec for 50 KHz PWM or 0.25 usec for 100 KHz PWM.

To achieve the required fall time, a fast turn-on characteristic of BJT is utilized.

For this purpose, NPN BJT 430 is used.

While NPN BJT 430 is in transition from OFF to ON, PNP BJT 422 is still ON, which makes significant power dissipation in BJT 430.

To limit power dissipation of BJT 430 to its spec limit, collector current of 222 needs to be limited. For this purpose, Current feedback generator 416 is used to provide a constant current during transition. To achieve the required rise time, a fast turn-on characteristic of BJT is utilized. For this purpose, PNP BJT 422 and 405 are used.

A current to supply is identified by the equation below.

Rise time=Gate drain charge of the FET/supply current

A current sensing resistor R1 and a zener diode Z1 of Current feedback generator 416 are set to provide a required current.

To make gate driver compatible with vehicle Load Dump transient, 50V peak for unsuppressed Load Dump, Vice/Vbe rating of BJT devices 405, 422 and 430 needs to be 65V or a higher.

Design Detail of Current Feedback Generator 416

Figure 5:
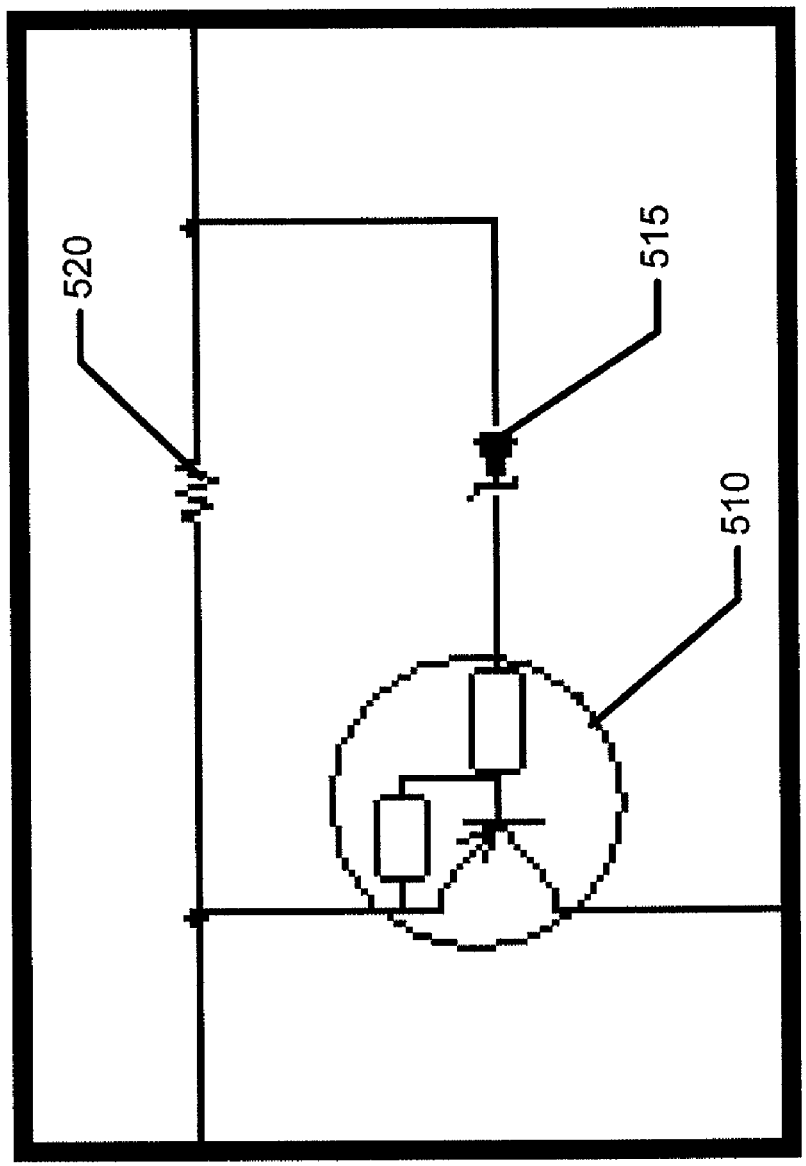
FIG. 5 one embodiment of a current feedback generator.

Referring to FIG. 5, current feedback generator 416 consists of BJT 510, zener diode 515 and resistor 520.

Functions of the components are described as follows:

Resistor 520: Provides a feedback signal the voltage of which is proportional to BJT 422.

2V Zener diode 515: Compares the feedback signal with the zener voltage and provides a current to BJT 510 base, which drives BJT 510 to produce a feedback current provided to Base of BJT 222.

The function of Current feedback generator 416 is to provide a feedback to limit current from collector of 422.

Emitter current of 422 is used as a feedback as it represents collector current with a tolerance of less than 2%.

Feedback components' values are set as follows:

BJT 510 has two resistors.

One is R_be, which is put between base and emitter.

The other is R_bb, which is connected between base of BJT and the base terminal.

BJT is chosen to have R_be/R_bb>>1, so that turn on threshold voltage can be minimized.

$V\text{th}=0.7V$ nominal $I\_\text{emitter}\_222 \times R1 = Vz1$ (sneer voltage of Z1)+$V\text{th}$ $I\_\text{emitter}\_222 = Vz1$ (sneer voltage of Z1)+$V\text{th}$ For zener diode 515, a 2V zener diode is used.

Design Detail of the Second Gate Driver 110

Figure 6:
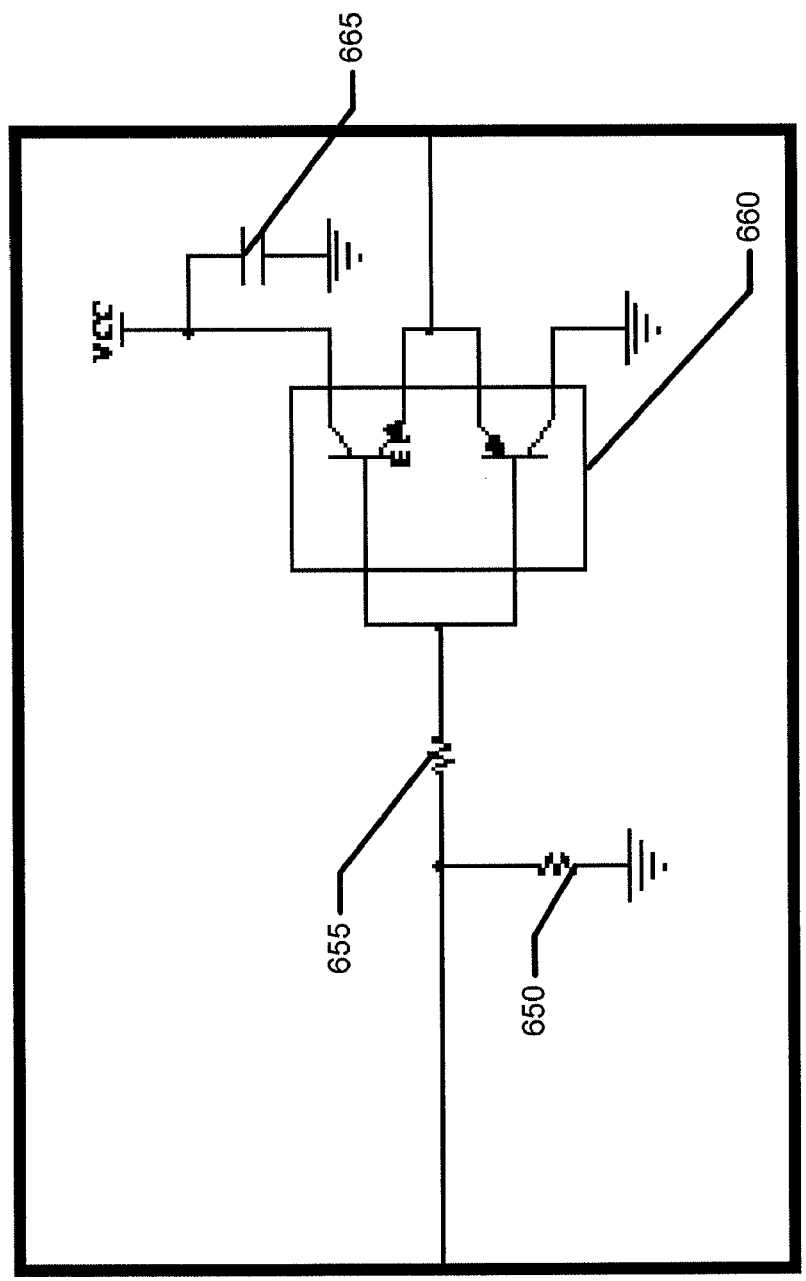
FIG. 6 shows one embodiment of second gate driver design.

Referring to FIG. 6, second gate driver 110 consists of a PNP-NPN dual BJT 660, decoupling capacitor 665, Resistors 655 and 650.

Functions of the components are described as follows[[.]]:

PNP-NPN dual BJT 660: Provides a high or low level depending on input signal, LSD_PWM.

Resistor 655: Limits current to or from the bases of PNP-NPN dual BJT 660.

Resistor 650: Provides a low impedance to PNP-NPN dual BJT 660, which prevents unintended activation of 660 by noises.

It needs to confirm that 660 has enough power dissipation capability.

Required power dissipation is derived from gate charge spec of the FET.

Power_dissipation=Gate charge of the FET×5V× PWM Frequency.

Gate-source voltage suppresser

It consists of zener diode 142 having 14V or lower for zener voltage and a general purpose diode 143.

It suppresses gate to source voltage of High side FET 115 below the spec limit 16V and protects FET from high voltage.

Figure 7:
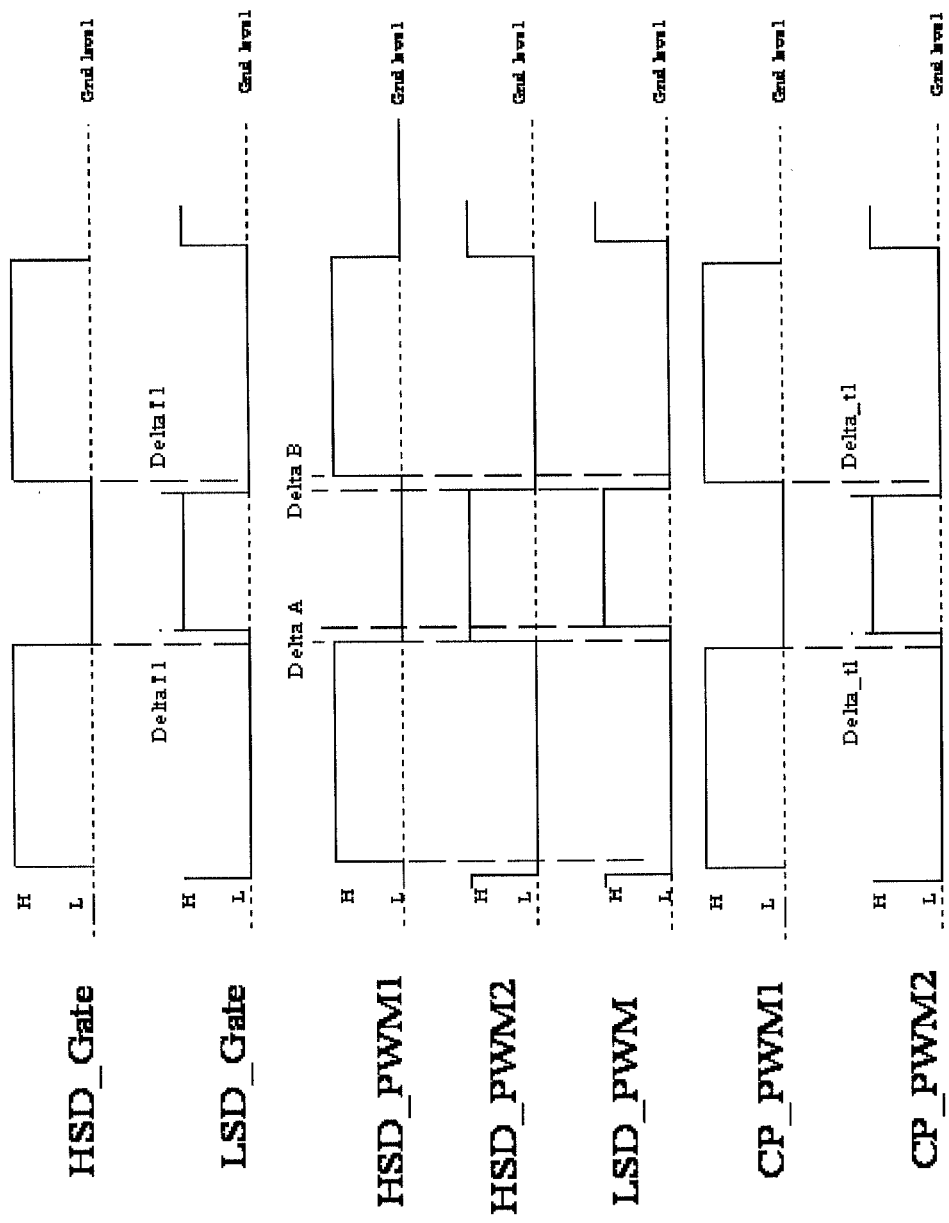
FIG. 7 shows a timing diagram for one embodiment of Low Loss Low Noise Automotive Motor Control System.

Low Loss Low noise automotive motor control System requires following timing signals produced by the Microprocessor unit U1 for the PWM gate drivers and the charge pump. These timing signals are shown in FIG. 7. The Low Loss Low Noise Motor Control System includes the use of at least three timing signals from MCU 145: HSD PWM 150, LSD PWM 155 and CP_PWM 160. HSD PWM 150 is applied to gate driver 105 for high side FET U6. LSD PWM 155 is applied to gate driver 110 for low side FET 125. CP_PWM 160 is applied to charge pump circuit 165. ~HSD PWM 170 (Inverted HSD PWM) is optional, which can be used to simplify the gate driver and allow for the motor to be reversed.

The methods, structures, and materials described heretofore to accomplish the stated theme are presented to provide a breath of scope in conformance with the introduction and development of a new technology. The described systems and methods may also be applied to dimmers, in order to reduce the ringing that occurs in lighting systems. Any variation on the theme and methodology of accomplishing the same that are not described heretofore would be considered under the scope of embodiments of the Low Loss Noise Reduction System.

What is claimed:

1. A system for providing controlled power to a motor in an automobile, comprising:

(a) a first gate driver and a second gate driver;

(b) a high side FET;

(c) a low side FET;

(d) a charge pump circuit including:

a first resistor configured to limit current of a first BJT, a second resistor configured to provide a feedback signal of a voltage which is proportional to emitter current of the first BJT, a current feedback generator which converts the feedback signal to a control signal suitable for a base of the first BJT, which adjusts a base voltage of the first BJT and causes the first BJT to supply a constant current while a CP_PWM2 285 signal is high, the first BJT provides a current provided from a first battery to a first diode, a first capacitor, via a collector of the first BJT, an emitter of the first BJT is connected to the second resistor and a ground, which charges the first capacitor, when the CP_PWM2 signal is high, a second BJT that provides a current to base of a third BJT when a CP_PWM1 signal is high, which turns ON the third BJT, a third resistor which limits a base current of the third BJT and a collector current of the second BJT, a fourth resistor which prevents unintended turning-on of the third BJT by a leakage current through the second BJT, the third BJT provides a high voltage charging current to a VCP node through a fifth resistor, the first capacitor, and a first diode when the third BJT is ON, the fifth resistor limits first battery source current supplied to the VCP node through the fifth resistor, the first capacitor, and the first diode when the third BJT is ON, the first capacitor charge is increased while the first BJT is ON and the increased charge is transferred to the VCP node while the third BJT is ON, a second capacitor which is charged while the third BJT is ON and provides increased charge to the VCP node when the third BJT is OFF, the first diode prevents a current flowing into the first battery while the third BJT is ON, a second diode prevents current flowing into the first capacitor from the second capacitor while the first BJT is ON, and a sixth resistor provides a current to discharge the second capacitor when the VCP node is OFF;

(e) an inductor capacitor filter; and (f) a plurality of timing signals including the CP_PWM2 signal and CP_PWM1 signal.

2. The system of claim 1 wherein the plurality of timing signals further include an HSD PWM signal and an LSD PWM signal, wherein the HSD PWM signal is applied to the first gate driver and the LSD PWM signal is applied to the second gate driver 110 for low side FET 125.

3. The system of claim 1 wherein the first gate driver includes a first gate driver capacitor, a first and second first gate driver resistor, a first gate driver current feedback generator, a first gate driver BJT, a second gate driver BJT, a third gate driver BJT, and a third gate driver resistor.

4. The system of claim 1 wherein the second gate driver includes a first PNP-NPN dual BJT, a first second gate driver capacitor, and first and second gate driver resistors.

5. The system of claim 1, further comprising:
(g) a sense resistor;
(h) a first and second operational amplifier, for MCUs monitoring active and passive motor current and protecting the high side FET and the low side FET.

* * * * *